United States Patent
Ohashi et al.

(10) Patent No.: US 10,043,883 B2
(45) Date of Patent: Aug. 7, 2018

(54) SEMICONDUCTOR DEVICE, AND METHOD OF MANUFACTURING SEMICONDUCTOR DEVICE

(71) Applicant: Kabushiki Kaisha Toshiba, Minato-ku (JP)

(72) Inventors: Teruyuki Ohashi, Kawasaki (JP); Ryosuke Iijima, Setagaya (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 23 days.

(21) Appl. No.: 14/813,651

(22) Filed: Jul. 30, 2015

(65) Prior Publication Data

US 2016/0087064 A1    Mar. 24, 2016

(30) Foreign Application Priority Data

Sep. 22, 2014 (JP) ................. 2014-193015

(51) Int. Cl.
  *H01L 29/51*    (2006.01)
  *H01L 21/04*    (2006.01)
  (Continued)

(52) U.S. Cl.
  CPC .......... *H01L 29/513* (2013.01); *H01L 21/049* (2013.01); *H01L 21/263* (2013.01);
  (Continued)

(58) Field of Classification Search
  CPC ............... H01L 29/513; H01L 29/4958; H01L 21/3105; H01L 29/42364; H01L 29/1608;
  (Continued)

(56) References Cited

U.S. PATENT DOCUMENTS 6,972,436 B2 * 12/2005 Das ................... H01L 21/045
                                                            257/411
9,214,516 B2 * 12/2015 Mine .................. H01L 21/049
(Continued)

FOREIGN PATENT DOCUMENTS

JP        11-266017       9/1999
JP      2002-222943       8/2002
(Continued)

OTHER PUBLICATIONS

Extended European Search Report dated Feb. 12, 2016 in Patent Application No. 15176905.6.
(Continued)

*Primary Examiner* — Latanya N Crawford
(74) *Attorney, Agent, or Firm* — Oblon, McClelland, Maier & Neustadt, L.L.P.

(57) ABSTRACT

A semiconductor device according to an embodiment includes a wide bandgap semiconductor layer, a gate electrode and a gate insulating film provided between the wide bandgap semiconductor layer and the gate electrode. The gate insulating film includes a first insulating film having a thickness of 7 nm or greater, a fixed charge film provided on the first insulating film, the fixed charge film containing fixed charge and a second insulating film provided on the fixed charge film, the second insulating film having a thickness of 7 nm or greater. The gate insulating film has a total thickness of 25 nm or greater.

17 Claims, 6 Drawing Sheets

(51) Int. Cl.
*H01L 21/28* (2006.01)
*H01L 21/263* (2006.01)
*H01L 21/3105* (2006.01)
*H01L 29/16* (2006.01)
*H01L 29/20* (2006.01)
*H01L 29/40* (2006.01)
*H01L 29/423* (2006.01)
*H01L 29/49* (2006.01)

(52) U.S. Cl.
CPC .... *H01L 21/28264* (2013.01); *H01L 21/3105* (2013.01); *H01L 29/1608* (2013.01); *H01L 29/2003* (2013.01); *H01L 29/401* (2013.01); *H01L 29/42364* (2013.01); *H01L 29/4958* (2013.01); *H01L 29/517* (2013.01); *H01L 29/518* (2013.01)

(58) Field of Classification Search
CPC . H01L 29/401; H01L 29/517; H01L 29/2003; H01L 21/263; H01L 29/518; H01L 21/28264; H01L 21/049; H01L 21/28282; H01L 21/022
See application file for complete search history.

(56) References Cited

U.S. PATENT DOCUMENTS

| | | | |
|---|---|---|---|
| 9,741,557 B1* | 8/2017 | Dellas | H01L 21/0228 |
| 2002/0030191 A1* | 3/2002 | Das | H01L 21/045 |
| | | | 257/77 |
| 2003/0219972 A1* | 11/2003 | Green | H01L 21/02178 |
| | | | 438/623 |
| 2004/0087093 A1 | 5/2004 | Fukuda et al. | |
| 2004/0188762 A1 | 9/2004 | Shimamoto et al. | |
| 2005/0205966 A1* | 9/2005 | Potter | H01L 29/513 |
| | | | 257/532 |
| 2006/0273357 A1 | 12/2006 | Shimamoto et al. | |
| 2007/0007546 A1* | 1/2007 | Goto | G01N 27/4141 |
| | | | 257/147 |
| 2007/0049054 A1* | 3/2007 | Ahn | C23C 16/40 |
| | | | 438/785 |
| 2008/0067576 A1 | 3/2008 | Yaegashi | |
| 2008/0135880 A1 | 6/2008 | Yoshida et al. | |
| 2008/0237697 A1* | 10/2008 | Shimizu | H01L 21/28282 |
| | | | 257/325 |
| 2009/0152617 A1* | 6/2009 | Ma | H01L 29/42348 |
| | | | 257/324 |
| 2010/0155817 A1* | 6/2010 | Cheng | G11C 16/3427 |
| | | | 257/324 |
| 2010/0221895 A1* | 9/2010 | Seino | H01J 37/32091 |
| | | | 438/478 |
| 2011/0147764 A1* | 6/2011 | Dhar | H01L 29/51 |
| | | | 257/77 |
| 2011/0165745 A1 | 7/2011 | Yaegashi | |
| 2011/0198701 A1 | 8/2011 | Lee et al. | |
| 2012/0146173 A1* | 6/2012 | Ohta | H01L 27/14632 |
| | | | 257/443 |
| 2012/0146728 A1 | 6/2012 | Makiyama et al. | |
| 2012/0238087 A1 | 9/2012 | Yaegashi | |
| 2012/0286349 A1* | 11/2012 | Tan | H01L 21/28273 |
| | | | 257/324 |
| 2013/0034941 A1* | 2/2013 | Dhar | H01L 21/3115 |
| | | | 438/285 |
| 2013/0234163 A1* | 9/2013 | Hamamura | H01L 29/513 |
| | | | 257/77 |
| 2013/0256747 A1 | 10/2013 | Sin et al. | |
| 2014/0035001 A1* | 2/2014 | Czornomaz | H01L 29/78 |
| | | | 257/192 |
| 2014/0084304 A1 | 3/2014 | Shimizu et al. | |
| 2014/0264639 A1* | 9/2014 | Frank | H01L 29/42364 |
| | | | 257/411 |
| 2015/0179744 A1 | 6/2015 | Mine et al. | |
| 2016/0035631 A1* | 2/2016 | Lee | H01L 21/28088 |
| | | | 438/16 |

FOREIGN PATENT DOCUMENTS

| | | |
|---|---|---|
| JP | 2008-130672 | 6/2008 |
| JP | 2011-176168 | 9/2011 |
| JP | 2011-211223 | 10/2011 |
| JP | 2012-124436 | 6/2012 |
| JP | 2013-503479 | 1/2013 |
| JP | 2013-42054 | 2/2013 |
| JP | 2014-067909 | 4/2014 |
| WO | WO 2012/083590 A1 | 6/2012 |
| WO | WO 2014/010006 | 1/2014 |

OTHER PUBLICATIONS

Hiroyuki Matsunami, "Technological Breakthroughs in Growth Control of Silicon Carbide for High Power Electronic Devices" Japanese Journal of Applied Physics, vol. 43. No. 10, XP055091427, Oct. 1, 2004, pp. 6835-6847.

B. Jayant Baliga, "Switching Speed Enhancement in Insulated Gate Transistors by Electron Irradiation" IEEE Transactions on Electron Devices, vol. ED-31, No. 12, XP001285647, Dec. 1, 1984, pp. 1790-1795.

Kurylo, A. et al., "MIS Digital Capacitor by Electron Beam Irradiation" I P.com Journal, XP013076279, 1977, pp. 1-2 and cover page.

* cited by examiner

SEMICONDUCTOR DEVICE, AND METHOD OF MANUFACTURING SEMICONDUCTOR DEVICE

CROSS-REFERENCE TO RELATED APPLICATION

This application is based upon and claims the benefit of priority from Japanese Patent Application No. 2014-193015, filed on Sep. 22, 2014, the entire contents of which are incorporated herein by reference.

FIELD

Embodiments described herein relate generally to a semiconductor device, and a method of manufacturing semiconductor device.

BACKGROUND

A wide bandgap semiconductor such as SiC (silicon carbide) or GaN (gallium nitride) has better physical values than Si (silicon), in terms of dielectric breakdown strength, electron saturation speed, thermal conductivity, and the like. Accordingly, such materials are expected as materials for next-generation semiconductor devices, particularly for power semiconductor devices.

A power device that performs switching operation, such as a transistor, preferably has a sufficiently high threshold voltage for security reasons. However, in a transistor using a wide bandgap semiconductor, it is difficult to realize a sufficiently high threshold voltage.

In a MOSFET (Metal Oxide Semiconductor Field Effect Transistor) using SiC, for example, the threshold voltage becomes lower due to the influence of interface levels existing between the semiconductor and the gate insulating film. In a HEMT (High Electron Mobility Transistor) using a GaN-based semiconductor, for example, there is the problem of "normally-on operation" in which conduction is achieved without application of voltage to the gate electrode, due to the existence of a two-dimensional electron gas under the gate electrode.

Particularly, in a MOSFET using SiC, if interface nitriding is performed so as to increase mobility, the threshold voltage becomes lower. This trade-off is more prominent in a MOSFET having a high carrier mobility.

DETAILED DESCRIPTION

Figure 1:
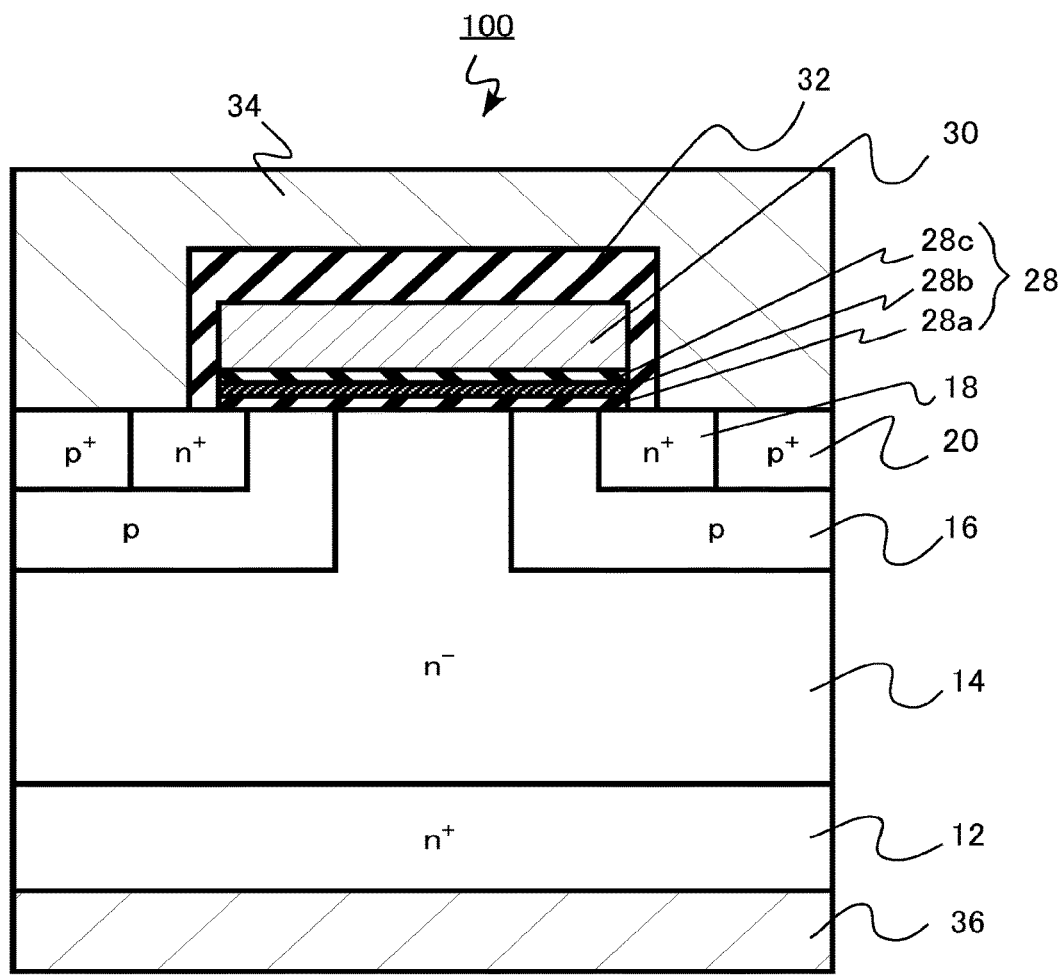
FIG. 1 is a schematic cross-sectional diagram showing the structure of a semiconductor device according to a first embodiment.

A semiconductor device according to an embodiment includes: a wide bandgap semiconductor layer; a gate electrode; and a gate insulating film provided between the wide bandgap semiconductor layer and the gate electrode, the gate insulating film including: a first insulating film having a thickness of 7 nm or greater; a fixed charge film provided on the first insulating film, the fixed charge film containing fixed charge; and a second insulating film provided on the fixed charge film, the second insulating film having a thickness of 7 nm or greater, the gate insulating film having a total thickness of 25 nm or greater.

The following is a description of embodiments, with reference to the accompanying drawings. In the description below, same or similar components are denoted by same reference numerals, and explanation of components described once will not be repeated.

In this specification, a "wide bandgap semiconductor" means a semiconductor having a wider bandgap than that of silicon.

In this specification, a "GaN-based semiconductor" means a semiconductor containing GaN (gallium nitride), AlN (aluminum nitride), InN (indium nitride), or any intermediate composition of these materials.

In the description below, $n^+$, n, $n^-$, $p^+$, p, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where the $n^+$-type and the $n^-$-type are referred to simply as the n-type, and the $p^+$-type and the $p^-$-type are referred to simply as the p-type.

(First Embodiment)

A semiconductor device according to this embodiment includes: a wide bandgap semiconductor layer; a gate electrode; and a gate insulating film provided between the wide bandgap semiconductor layer and the gate electrode, the gate insulating film including: a first insulating film having a thickness of 7 nm or greater; a fixed charge film provided on the first insulating film, the fixed charge film containing fixed charge; and a second insulating film provided on the fixed charge film, the second insulating film having a thickness of 7 nm or greater, the gate insulating film having a total thickness of 25 nm or greater.

More specifically, a SiC substrate having a first plane and a second plane; an n-type SiC layer provided on the first plane; a p-type first SiC region provided on the n-type SiC layer; an n-type second SiC region provided on the p-type first SiC region; a gate electrode; a gate insulating film provided between the p-type first SiC region and the gate electrode, the gate insulating film including: a first insulating film having a thickness of 7 nm or greater; a fixed charge film provided on the first insulating film, the fixed charge film containing fixed charge; and a second insulating film provided on the fixed charge film, the second insulating film having a thickness of 7 nm or greater, the gate insulating film having a total thickness of 25 nm or greater; a first electrode provided on the n-type second SiC region; and a second electrode provided on the second plane.

FIG. 1 is a schematic cross-sectional diagram showing the structure of a MOSFET that is the semiconductor device according to this embodiment. The MOSFET 100 is an n-type Double Implantation MOSFET (DIMOSFET) in which the p-channels and the source regions are formed by ion implantation.

The MOSFET 100 includes an n$^+$-type SiC substrate 12 having first and second planes. In FIG. 1, the first plane is the upper surface, and the second plane is the lower surface.

The SiC substrate 12 is a 4H—SiC SiC substrate containing N (nitrogen), for example, as the n-type impurity at an impurity concentration not lower than $1\times10^{18}$ cm$^{-3}$ and not higher than $1\times10^{20}$ cm$^{-3}$, for example. The first plane is a surface tilted zero to eight degrees with respect to the silicon face written as the {0001} face, for example. The second plane is a surface tilted zero to eight degrees with respect to the carbon face written as the {000-1} face, for example.

An n$^-$-type drift layer (the n-type SiC layer) 14 containing the n-type impurity at an impurity concentration not lower than $5\times10^{15}$ cm$^{-3}$ and not higher than $2\times10^{16}$ cm$^{-3}$, for example, is formed on the first plane of the SiC substrate 12. The drift layer 14 is a SiC epitaxially grown layer formed on the SiC substrate 12 by epitaxial growth, for example.

The surface of the drift layer 14 is also a surface tilted zero to eight degrees with respect to the silicon face. The thickness of the drift layer 14 is not smaller than 5 μm and not greater than 100 μm, for example.

P-type p-channel regions (the p-type first SiC region, the wide bandgap semiconductor layer) 16 containing the p-type impurity at an impurity concentration not lower than $5\times10^{15}$ cm$^{-3}$ and not higher than $1\times10^{17}$ cm$^{-3}$, for example, are formed on part of the surface of the drift layer 14. The depth of the p-channel regions 16 is approximately 0.6 μm, for example. The p-channel regions 16 function as the channel regions of the MOSFET 100.

N$^+$-type source regions (the n-type second SiC region) 18 containing the n-type impurity at an impurity concentration not lower than $1\times10^{18}$ cm$^{-3}$ and not higher than $1\times10^{22}$ cm$^{-3}$, for example, are formed on part of the surfaces of the p-channel regions 16. The depth of the source regions 18 is smaller than the depth of the p-channel regions 16, and is approximately 0.3 μm, for example.

P$^+$-type p-contact regions 20 containing the p-type impurity at an impurity concentration not lower than $1\times10^{18}$ cm$^{-3}$ and not higher than $1\times_{10}^{22}$ cm$^{-3}$, for example, are formed on part of the surfaces of the p-channel regions 16 and on the sides of the source regions 18. The depth of the p-contact regions 20 is smaller than the depth of the p-channel regions 16, and is approximately 0.3 μm, for example.

The MOSFET 100 includes agate insulating film 28 formed on the surfaces of the p-channel regions 16. The gate insulating film 28 includes a first insulating film 28a, a fixed charge film 28b provided on the first insulating film 28a and containing fixed charges, and a second insulating film 28c provided on the fixed charge film 28b.

A gate electrode 30 is formed on the gate insulating film 28. The gate electrode 30 may be made of doped polysilicon, for example. An interlayer insulating film 32 formed with a silicon oxide film, for example, is formed on the gate electrode 30.

The first insulating film 28a has a function to restrain charge movement between the fixed charge film 28b and the p-channel regions 16. For example, injection of charges from the p-channel regions 16 into the fixed charge film 28b is restrained. Also, release of fixed charges from the fixed charge film 28b to the p-channel regions 16 is restrained, for example. The first insulating film 28a is a silicon oxide film, a silicon oxynitride film, or an aluminum oxide film, for example.

The second insulating film 28c has a function to restrain charge movement between the gate electrode 30 and the fixed charge film 28b. For example, injection of charges from the gate electrode 30 into the fixed charge film 28b is restrained. Also, release of fixed charges from the fixed charge film 28b to the gate electrode 30 is restrained, for example. The second insulating film 28c is a silicon oxide film or an aluminum oxide film, for example.

Each of the first insulating film 28a and the second insulating film 28c may be a film formed by stacked films of different materials.

The fixed charge film 28b has a function to control the threshold voltage of the MOSFET 100, containing fixed charges in the film. The fixed charges are negative charges, for example, and are electrons trapped in levels existing in the bandgap of the fixed charge film 28b, for example.

The thickness of the first insulating film 28a is not smaller than 7 nm and not greater than 30 nm. The thickness of the first insulating film 28a is preferably not smaller than 10 nm and not greater than 25 nm.

The thickness of the second insulating film 28c is not smaller than 7 nm and not greater than 50 nm. The thickness of the second insulating film 28c is preferably not smaller than 10 nm and not greater than 40 nm.

The total thickness of the gate insulating film 28 is not smaller than 25 nm and not greater than 60 nm. The total thickness of the gate insulating film 28 is preferably not smaller than 30 nm and not greater than 50 nm.

The p-channel regions 16 that are located below the gate electrode 30 and are interposed between the drift layer 14 and the source regions 18 function as the channel regions of the MOSFET 100.

The MOSFET 100 includes a conductive source electrode 34 formed over the source regions 18 and electrically connected to the source regions 18 and the p-contact regions 20. The source electrode 34 also functions as an electrode to apply potential to the p-channel regions 16.

The source electrode 34 is formed with a Ni (nickel) barrier metal layer and an Al (aluminum) metal layer stacked on the barrier metal layer, for example. The Ni barrier metal layer and the Al metal layer may form an alloy through a reaction.

A conductive drain electrode 36 is formed on the opposite side of the SiC substrate 12 from the drift layer 14, or on the second plane side of the SiC substrate 12. The drain electrode 36 is formed with a Ni (nickel) barrier metal layer and an Al (aluminum) metal layer stacked on the barrier metal layer, for example. The Ni barrier metal layer and the Al metal layer may form an alloy through a reaction.

In this embodiment, the n-type impurity is preferably N (nitrogen) or P (phosphorus), for example, but it is also possible to use As (arsenic), Sb (antimony), or the like. The p-type impurity is preferably Al (aluminum), for example, but it is also possible to use B (boron), Ga (gallium), In (indium), or the like.

Next, the functions and the effects of the semiconductor device according to this embodiment are described.

A power device to which a high voltage is to be applied preferably has a sufficiently high threshold voltage for security reasons. However, in a case where SiC is used, the threshold voltage becomes lower due to the interface levels, the fixed charges, and the like between the gate insulating film and the channel regions, for example, and it might be difficult to realize a high threshold voltage.

The MOSFET 100 according to this embodiment includes the fixed charge film 28b that stores electrons that are negative charges as the fixed charges in the gate insulating film 28. Accordingly, the threshold voltage of the MOSFET 100 shifts to the positive side. In other words, the threshold voltage of the MOSFET 100 becomes higher than that in a case where the fixed charge film 28b is not employed. Thus, the MOSFET 100 having a high threshold voltage can be realized.

Furthermore, in this embodiment, the fixed charge film 28b is interposed between the first insulating film 28a and the second insulating film 28c, so that charge injection from the p-channel regions 16 and the gate electrode 30 into the fixed charge film 28b during operation of the MOSFET 100 is restrained. Also, release of the fixed charges from the fixed charge film 28b to the p-channel regions 16 and the gate electrode 30 during operation of the MOSFET 100 is restrained. Accordingly, the threshold voltage of the MOSFET 100 is restrained from fluctuating. Thus, the MOSFET 100 with a stable threshold voltage is realized.

Also, as the first insulating film 28a is provided between the fixed charge film 28b and the p-channel regions 16, physical distances can be maintained between the p-channel regions 16 and the fixed charges. Accordingly, scattering of electrons traveling in the p-channel regions 16 due to the fixed charges can be restrained. Thus, the mobility decrease due to the fixed charges is reduced, and the MOSFET 100 with a high mobility is realized.

The thickness of the first insulating film 28a is not smaller than 7 nm and not greater than 20 nm. The thickness of the first insulating film 28a is preferably not smaller than 10 nm and not greater than 15 nm.

If the thickness of the first insulating film 28a is smaller than the above mentioned range, electron tunneling from the sides of the p-channel regions 16 to the fixed charge film 28b might occur, for example, and the threshold voltage of the MOSFET 100 might fluctuate. Also, electron tunneling from the side of the fixed charge film 28b to the p-channel regions 16 might occur, for example, and the threshold voltage of the MOSFET 100 might fluctuate. In this embodiment, the thickness of the first insulating film 28a is set so that the direct tunneling probability of the first insulating film 28a becomes sufficiently low. In this manner, electron tunneling is restrained, and threshold voltage fluctuation during operation of the MOSFET 100 is restrained. If the thickness of the first insulating film 28a exceeds the above mentioned range, it might become difficult to perform transistor control with a gate voltage.

The thickness of the second insulating film 28c is not smaller than 7 nm and not greater than 20 nm. The thickness of the second insulating film 28c is preferably not smaller than 10 nm and not greater than 15 nm.

If the thickness of the second insulating film 28c is smaller than the above mentioned range, electron tunneling from the side of the gate electrode 30 to the fixed charge film 28b might occur, for example, and the threshold voltage of the MOSFET 100 might fluctuate. Also, electron tunneling from the side of the fixed charge film 28b to the gate electrode 30 might occur, for example, and the threshold voltage of the MOSFET 100 might fluctuate. In this embodiment, the thickness of the second insulating film 28c is set so that the direct tunneling probability of the second insulating film 28c becomes sufficiently low. In this manner, electron tunneling is restrained, and threshold voltage fluctuation during operation of the MOSFET 100 is restrained. If the thickness of the second insulating film 28c exceeds the above mentioned range, it might become difficult to perform transistor control with a gate voltage.

The fixed charge film 28b is preferably a silicon-rich silicon nitride film. The silicon-rich nitride film has a higher silicon composition ratio than the silicon composition ratio of a silicon nitride film that matches the stoichiometric ratio. That is, the Si/N ratio of the silicon-rich silicon nitride film is higher than the Si/N ratio (3/4=0.75) of a silicon nitride film $Si_3N_4$ that matches the stoichiometric ratio. The silicon-rich silicon nitride film can trap electrons in its film. As electrons are trapped, negative charges are stored as fixed charges in the fixed charge film 28b.

Alternatively, the fixed charge film 28b is preferably an aluminum-rich aluminum oxide film. The aluminum-rich aluminum oxide film has a higher aluminum composition ratio than the aluminum composition ratio of an aluminum oxide film that matches the stoichiometric ratio. That is, the Al/O ratio of the aluminum-rich aluminum oxide film is higher than the Al/O ratio (2/3=0.67) of an aluminum oxide film $Al_2O_3$ that matches the stoichiometric ratio. The aluminum-rich aluminum oxide film can trap electrons in its film. As electrons are trapped, negative charges are stored as fixed charges in the fixed charge film 28b.

Also, the fixed charge film 28b may be an oxide containing at least one metal selected from among Zr (zirconium), Ti (titanium), and Hf (hafnium), and preferably contain at least one element selected from the first group consisting of W (tungsten), Mo (molybdenum), Cr (chromium), Mn (manganese), Fe (iron), Tc (technetium), Re (rhenium), Ru (ruthenium), Os (osmium), Rh (rhodium), Ir (iridium), Pd (palladium), Pt (platinum), Co (cobalt), and Ni (nickel). As a result of the first-principle calculation, it has become apparent that, when at least one element selected from the first group is added to an oxide containing at least one metal selected from among Zr (zirconium), Ti (titanium), and Hf (hafnium), levels are generated in the bandgap.

Some of the levels generated in the bandgap are filled with electrons, and the others are free of electrons. If electrons are injected into the vacant levels, negative charges are stored as fixed charges in the fixed charge film 28b. If the existing electrons are removed, more positive charges than before the electron removal are stored as fixed charges.

Alternatively, the fixed charge film 28b may be an oxide containing at least one metal selected from among Zr (zirconium), Ti (titanium), and Hf (hafnium), and preferably contain at least one element selected from the first group consisting of W (tungsten), Mo (molybdenum), Cr (chromium), Mn (manganese), Fe (iron), Tc (technetium), Re (rhenium), Ru (ruthenium), Os (osmium), Rh (rhodium), Ir (iridium), Pd (palladium), Pt (platinum), Co (cobalt), and Ni (nickel), and at least one element selected from a second group consisting of N (nitrogen), C (carbon), B (boron), Mg (magnesium), Ca (calcium), Sr (strontium), Ba (barium), Al (aluminum), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

The fixed charges in the fixed charge film 28b are preferably located at deep levels, so as to restrain release of fixed charges from the fixed charge film 28b. As a result of the first-principle calculation, it has become apparent that, when at least one element selected from the second group is further added to an oxide containing at least one metal selected from among Zr (zirconium), Ti (titanium), and Hf (hafnium), and at least one element selected from the first group, the levels generated in the bandgap become deeper.

The midgap of SiC is located 5.4 eV lower than the vacuum level. Therefore, the fixed charges in the fixed charge film 28b are preferably located in the levels of 5.4±1.0 eV, so as to restrain release of fixed charges to SiC or the p-channel regions 16. The levels in which fixed charges exist can be determined by identifying the structure and the chemical composition of the material of the fixed charge film 28b through the first-principle calculation, for example.

The total thickness of the gate insulating film 28 is not smaller than 25 nm and not greater than 80 nm. The total thickness of the gate insulating film 28 is preferably not smaller than 30 nm and not greater than 60 nm.

If the total thickness is smaller than the above mentioned range, there is a possibility that the reliability of the gate insulating film 28 is degraded. If the total thickness exceeds the above mentioned range, it might become difficult to perform transistor control with a gate voltage.

The area density of the fixed charges in the fixed charge film 28b is preferably not lower than $8.6 \times 10^{11}$ cm$^{-2}$ and not higher than $2.2 \times 10^{13}$ cm$^{-2}$, and more preferably, not lower than $5.0 \times 10^{12}$ cm$^{-2}$ and not higher than $2.2 \times 10^{13}$ cm$^{-2}$. If the area density is lower than the above mentioned range, a sufficient effect to increase the threshold voltage with fixed charges might not be achieved. If the area density exceeds the above mentioned range, the threshold voltage might become too high, and operating the MOSFET 100 might become difficult. The area density of the fixed charges in the fixed charge film 28b can be calculated through capacitance-voltage measurement carried out on the gate electrode, for example.

In a case where the thickness of the gate insulating film 28 is 60 nm or smaller, the first insulating film 28a and the second insulating film 28c are silicon oxide films, and the gate electrode 30 is formed with doped polysilicon, the threshold voltage of the MOSFET 100 can be increased by 7 to 22 V, if the area density of the electrons in the fixed charge film 28b is not lower than $8.6 \times 10^{11}$ cm$^{-2}$ and not higher than $2.2 \times 10^{13}$ cm$^{-2}$.

As described so far, this embodiment realizes the MOSFET 100 that has a high, stable threshold voltage and a high mobility.

(Second Embodiment)

A semiconductor device manufacturing method according to this embodiment includes: forming a first insulating film on a wide bandgap semiconductor layer; forming a fixed charge film on the first insulating film; applying electron beams onto the fixed charge film; forming a second insulating film on the fixed charge film; and forming a gate electrode on the second insulating film.

Figure 2:
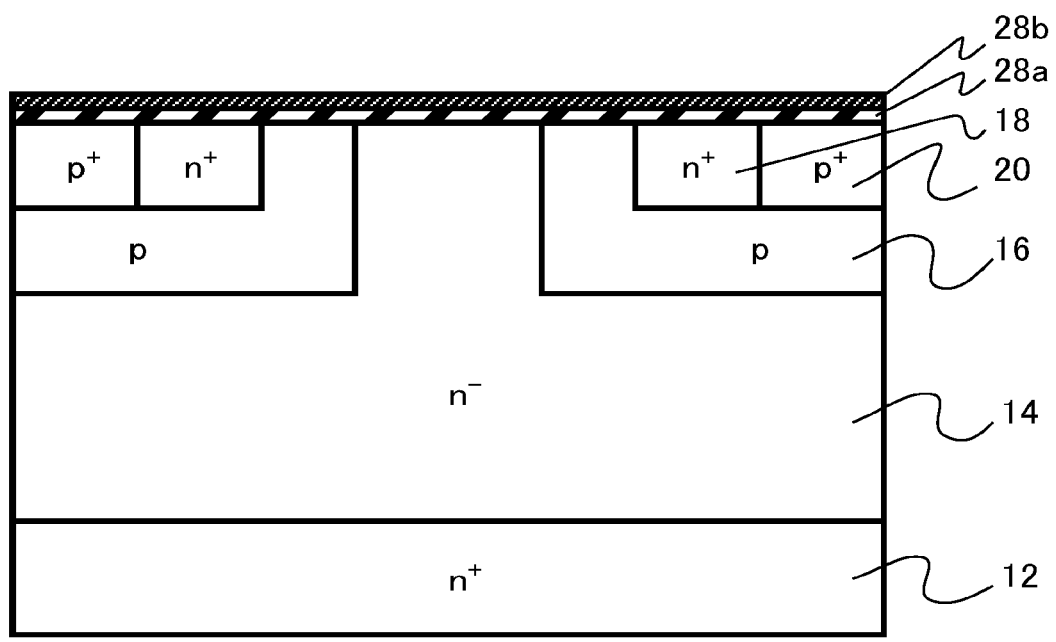
FIG. 2 is a schematic cross-sectional diagram showing the semiconductor device being manufactured by a semiconductor device manufacturing method according to a second embodiment.
Figure 3:
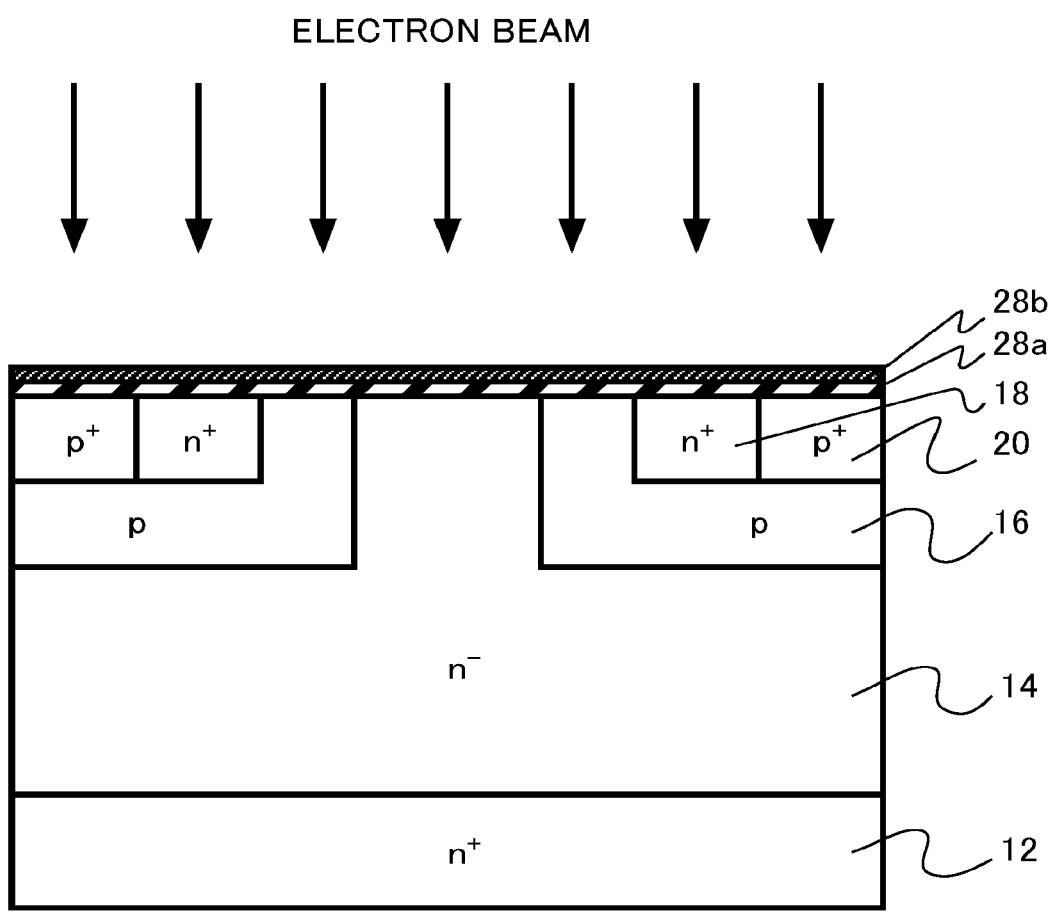
FIG. 3 is a schematic cross-sectional diagram showing the semiconductor device being manufactured by the semiconductor device manufacturing method according to the second embodiment.
Figure 4:
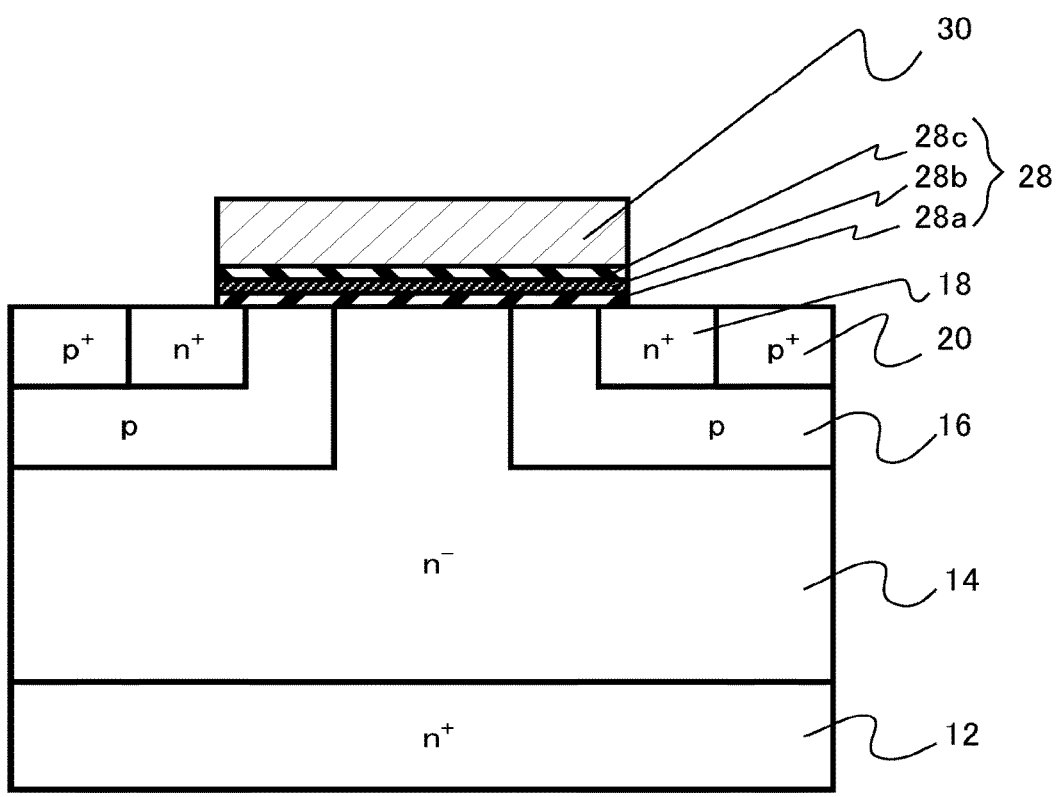
FIG. 4 is a schematic cross-sectional diagram showing the semiconductor device being manufactured by the semiconductor device manufacturing method according to the second embodiment.

In the description below, the semiconductor device manufacturing method according to this embodiment is explained, with the MOSFET 100 of the first embodiment being taken as an example. FIGS. 2, 3, and 4 are schematic cross-sectional diagrams showing the semiconductor device being manufactured by the semiconductor device manufacturing method according to this embodiment.

First, the n$^+$-type SiC substrate 12 having the first plane as the silicon face and the second plane as the carbon face is prepared. The n$^-$-type drift layer (a SiC semiconductor layer) 14 is then formed on the first plane of the SiC substrate 12 by an epitaxial growth technique.

The p-type p-channel regions 16, the n$^+$-type source regions 18, and the p$^+$-type p-contact regions 20 are then formed by a known photolithography technique and a known ion implantation technique.

The first insulating film 28a, which is a silicon oxide film, for example, is formed on the n$^-$-type drift layer (the SiC semiconductor layer) 14 through thermal oxidation, for example. The fixed charge film 28b, which is an insulating film, is then formed on the first insulating film 28a. A silicon-rich silicon nitride film is formed by LPCVD (Low Pressure Chemical Vapor Deposition), for example (FIG. 2).

Electron beams are then applied onto the fixed charge film 28b, and electrons are trapped in levels in the fixed charge film 28b, to turn into fixed charges (FIG. 3). In applying electron beams, a known electron beam apparatus can be used.

The second insulating film 28c, which is a silicon oxide film, for example, is formed on the fixed charge film 28b by LPCVD, for example.

The gate electrode 30 is then formed on the gate insulating film 28 by a known technique (FIG. 4). The gate electrode 30 is doped polysilicon formed by LPCVD, for example.

After that, the interlayer insulating film 32, the source electrode 34, and the drain electrode 36 are formed by a known process, and the MOSFET 100 shown in FIG. 1 is completed.

By the manufacturing method according to this embodiment, the MOSFET 100 having a high, stable threshold voltage and a high mobility is manufactured.

(Third Embodiment)

A semiconductor device according to this embodiment is the same as the semiconductor device of the first embodiment, except that an n-type third SiC region is further provided between the p-type first SiC region and the gate insulating film. Therefore, the same explanations as those in the first embodiment will not be repeated.

Figure 5:
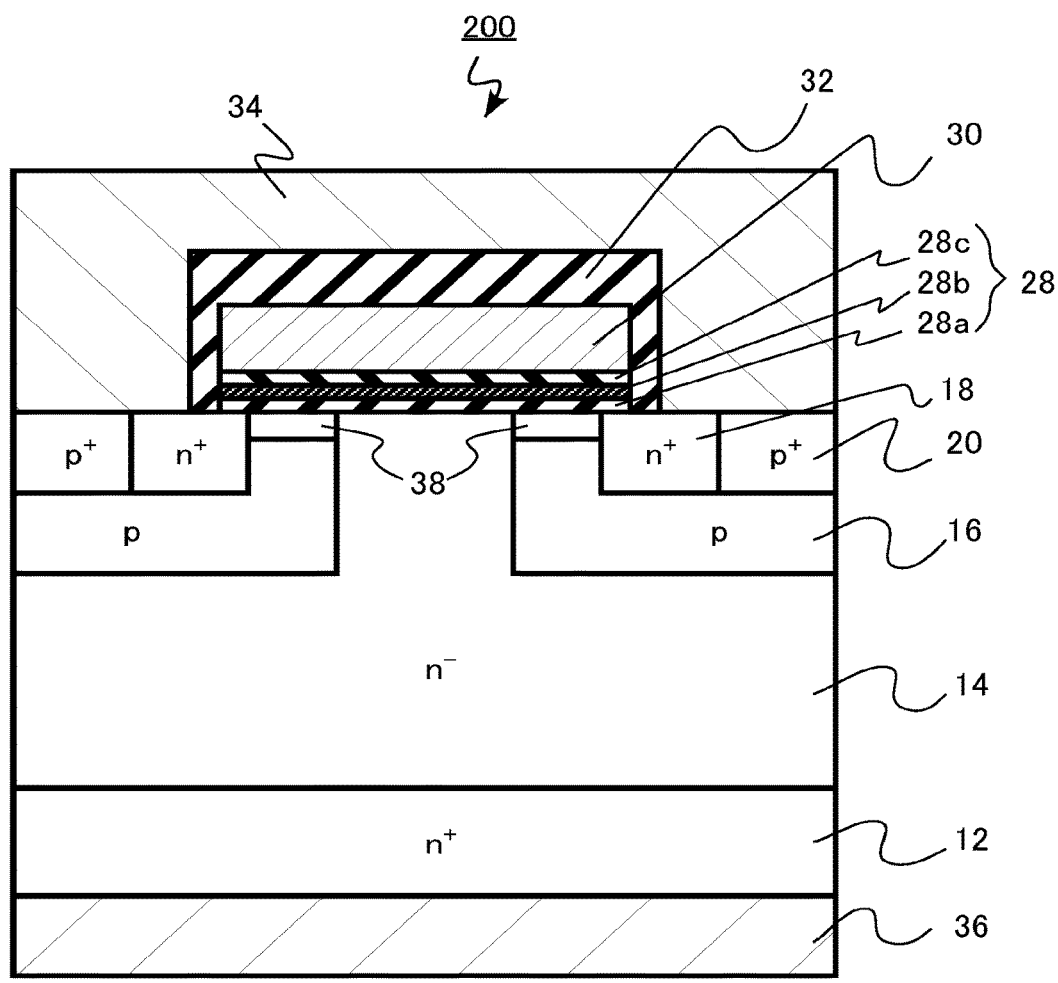
FIG. 5 is a schematic cross-sectional diagram showing the structure of a semiconductor device according to a third embodiment.

FIG. 5 is a schematic cross-sectional diagram showing the structure of a MOSFET that is the semiconductor device according to this embodiment. The MOSFET 200 is an n-type DIMOSFET in which the p-channels and the source regions are formed by ion implantation.

The MOSFET 200 has an n-type buried channel regions 38 between the gate insulating film 28 and the p-type p-channel regions (the p-type first SiC region) 16.

In a SiC MOSFET, electrons traveling in the channel regions are scattered due to the interface levels between the gate insulating film and the channel regions, and the mobility becomes lower. The MOSFET 200 according to this embodiment has a buried channel structure. With the buried channel structure, the interfaces between the gate insulating film and the channel regions can be isolated from the channels in which electrons are traveling. Accordingly, electron scattering can be restrained, and a high mobility can be realized.

A MOSFET having a buried channel structure normally has a lower threshold voltage. In this embodiment, however, the threshold voltage is made higher by virtue of the fixed charge film 28b that stores negative charges as fixed charges.

In this manner, this embodiment realizes the MOSFET 200 that has a higher mobility than that of the MOSFET 100 of the first embodiment while maintaining a high threshold voltage.

(Fourth Embodiment)

A semiconductor device according to this embodiment is the same as the semiconductor device of the first embodiment, except that the wide bandgap semiconductor layer is a HEMT using a GaN-based semiconductor. Therefore, the same explanations as those in the first embodiment will not be repeated.

Figure 6:
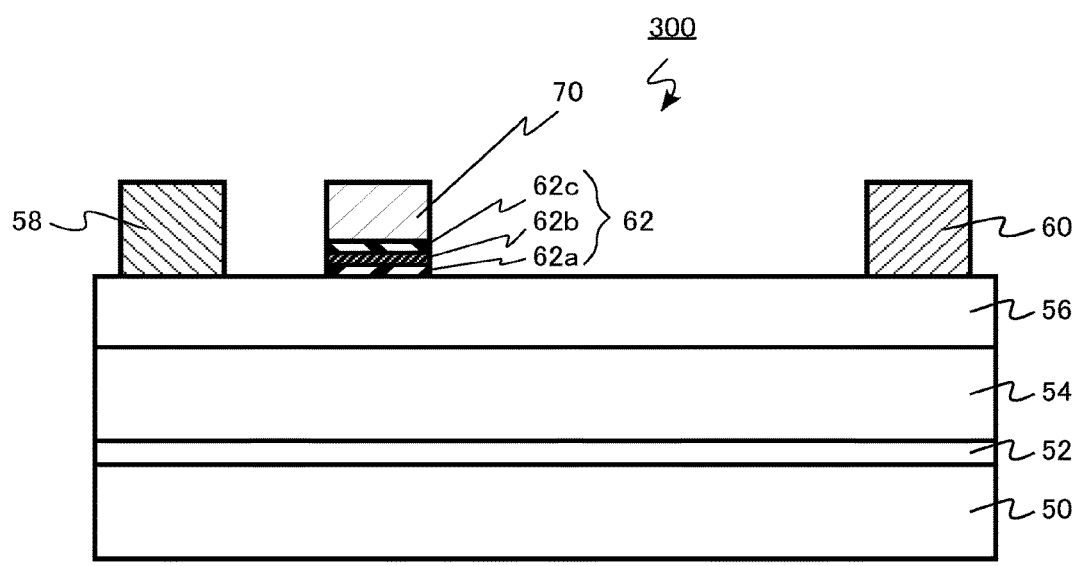
FIG. 6 is a schematic cross-sectional diagram showing the structure of a semiconductor device according to a fourth embodiment.

FIG. 6 is a schematic cross-sectional view of the semiconductor device according to this embodiment. The semiconductor device according to this embodiment is a HEMT using a GaN-based semiconductor.

As shown in FIG. 6, the HEMT (the semiconductor device) 300 includes a substrate 50, a buffer layer 52, a channel layer 54, a barrier layer (the wide bandgap semiconductor layer) 56, a source electrode 58, a drain electrode 60 and a gate insulating film 62.

The substrate 50 is formed with silicon (Si), for example. Instead of silicon, it is possible to use sapphire ($Al_2O_3$) or silicon carbide (SiC), for example.

The buffer layer 52 is provided on the substrate 50. The buffer layer 52 has a function to reduce lattice mismatch between the substrate 50 and the channel layer 54. The buffer layer 52 is formed with a multilayer structure of aluminum gallium nitride ($Al_WGa_{1-W}N$ (0<W<1)), for example.

The channel layer 54 is provided on the buffer layer 52. The channel layer 54 is undoped $Al_XGa_{1-X}N$ (0≤X<1), for example. More specifically, the channel layer 54 is undoped GaN, for example. The thickness of the channel layer 54 is not smaller than 0.5 μm and not greater than 3 μm, for example.

The barrier layer 56 is provided on the channel layer 54. The bandgap of the barrier layer 56 is wider than the bandgap of the channel layer 54. The barrier layer 56 is undoped $Al_YGa_{1-Y}N$ (0<Y≤1, X<Y), for example. More specifically, the barrier layer 56 is undoped $Al_{0.2}Ga_{0.8}N$, for example. The thickness of the barrier layer 56 is not smaller than 15 nm and not greater than 50 nm, for example.

There is a heterojunction interface between the channel layer 54 and the barrier layer 56. During on-state operation of the HEMT 300, a two-dimensional electron gas (2DEG) is formed in the heterojunction interface, and turns into a carrier.

The source electrode 58 and the drain electrode 60 are formed on the barrier layer 56. The source electrode 58 and the drain electrode 60 are metal electrodes, for example, and each of the metal electrodes is a stack structure formed with titanium (Ti) and aluminum (Al), for example. There are preferably ohmic contacts between the barrier layer 56 and the source and drain electrodes 58 and 60. The distance between the source electrode 58 and the drain electrode 60 is not shorter than 5 μm and not longer than 30 μm, for example.

The gate insulating film 62 is provided between the source electrode 58 and the drain electrode 60 on the barrier layer 56. The gate insulating film 62 includes a first insulating film 62a, a fixed charge film 62b provided on the first insulating film 62a and containing fixed charges, and a second insulating film 62c provided on the fixed charge film 62b.

A gate electrode 70 is formed on the gate insulating film 62. The gate electrode 70 may be made of doped polysilicon, for example.

A HEMT using a GaN-based semiconductor can be put into "normally-on operation" in which conduction is achieved without application of voltage to the gate electrode. For security purposes, however, a power device to which a high voltage is applied is preferably in "normally-off operation" in which conduction is not achieved unless a positive voltage is applied to the gate electrode.

In a power device using a GaN-based semiconductor, the gate electrode may have a trench structure so as to achieve "normally-off operation". In a device with a trench structure, however, there is a risk of a decrease in carrier mobility and degradation in reliability.

According to this embodiment, the threshold voltage of the HEMT 300 is made higher by virtue of the fixed charge film 62b that stores electrons as fixed charges. Thus, this embodiment realizes the HEMT 300 in "normally-off operation".

Although n-type MOSFETs have been described as examples of SiC MOSFETs in the above embodiments, the present disclosure can also be applied to p-type MOSFETs using SiC. So as to make the threshold voltage of a p-type MOSFET higher, positive charges should be stored in the charge storage film.

Furthermore, the present disclosure can be applied not only to MOSFETs but also to IGBTs (Insulated Gate Bipolar Transistors). And the present disclosure can be applied to trench MOSFETs While certain embodiments have been described, these embodiments have been presented by way of example only, and are not intended to limit the scope of the inventions. Indeed, the semiconductor device, and the method of manufacturing semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a wide bandgap semiconductor layer;
   a gate electrode; and
   a gate insulating film provided between the wide bandgap semiconductor layer and the gate electrode, the gate insulating film including: a first insulating film having a thickness of 7 nm or greater; a fixed charge film provided on the first insulating film, the fixed charge film containing fixed charge; and a second insulating film provided on the fixed charge film, the second insulating film having a thickness of 7 nm or greater, the gate insulating film having a total thickness of 25 nm or greater,
   wherein the fixed charge is negative charge, the wide bandgap semiconductor layer is SiC, the fixed charge is in an energy level of 5.4±1.0 eV, and an area density of the fixed charge is not lower than $8.6 \times 10^{11}$ $cm^{-2}$ and not higher than $2.2 \times 10^{13}$ $cm^{-2}$.

2. The device according to claim 1, wherein the total thickness of the gate insulating film is 30 nm or greater.

3. The device according to claim 1, wherein the fixed charge film is an aluminum-rich aluminum oxide film.

4. The device according to claim 1, wherein the fixed charge film is an oxide containing at least one metal selected from Zr (zirconium), Ti (titanium), and Hf (hafnium), and contains at least one element selected from a first group consisting of W (tungsten), Mo (molybdenum), Cr (chromium), Mn (manganese), Fe (iron), Tc (technetium), Re (rhenium), Ru (ruthenium), Os (osmium), Rh (rhodium), Ir (iridium), Pd (palladium), Pt (platinum), Co (cobalt), and Ni (nickel).

5. The device according to claim 4, wherein the fixed charge film contains at least one element selected from a second group consisting of N (nitrogen), C (carbon), B (boron), Mg (magnesium), Ca (calcium), Sr (strontium), Ba (barium), Al (aluminum), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

6. The device according to claim 1, wherein an area density of the fixed charge is not lower than $5.0 \times 10^{12}$ $cm^{-2}$ and not higher than $2.2 \times 10^{13}$ $cm^{-2}$.

7. The device according to claim 1, wherein the first insulating film has a thickness of 10 nm or greater, and the second insulating film has a thickness of 10 nm or greater.

8. The device according to claim 1 wherein the fixed charge film is a silicon-rich silicon nitride film.

9. A semiconductor device comprising:
a SiC substrate having a first plane and a second plane;
an n-type SiC layer provided on the first plane;
a p-type first SiC region provided on the n-type SiC layer;
an n-type second SiC region provided on the p-type first SiC region;
a gate electrode;
a gate insulating film provided between the p-type first SiC region and the gate electrode, the gate insulating film including: a first insulating film having a thickness of 7 nm or greater; a fixed charge film provided on the first insulating film, the fixed charge film containing fixed charge; and a second insulating film provided on the fixed charge film, the second insulating film having a thickness of 7 nm or greater, the gate insulating film having a total thickness of 25 nm or greater;
a first electrode provided on the n-type second SiC region;
a second electrode provided on the second plane; and
an n-type third SiC region provided between the p-type first SiC region and the gate insulating film. the p-type first SiC region, the n-type third SiC region and the gate insulating film being stacked in a direction perpendicular to the first plane, the n-type third SiC region being in contact with the n-type second SiC region,
wherein the fixed charge is negative charge, and the fixed charge film is a silicon-rich silicon nitride film.

10. The device according to claim 9, wherein the total thickness of the gate insulating film is 30 nm or greater.

11. The device according to claim 9, wherein the fixed charge is in an energy level of 5.4±1.0 eV.

12. A semiconductor device comprising: a wide bandgap semiconductor layer; a gate electrode; and a gate insulating film provided between the wide bandgap semiconductor layer and the gate electrode, the gate insulating film including; a first insulating film having a thickness of 7 nm or greater; a fixed charge film provided on the first insulating film, the fixed charge film containing fixed charge; and a second insulating film provided on the fixed charge film, the second insulating film having a thickness of 7 nm or greater, the gate insulating film having a total thickness of 25 nm or greater, wherein the fixed charge is negative charge, the wide bandgap semiconductor layer is a GaN-based semiconductor, and the fixed charge film is a silicon-rich silicon nitride film.

13. The device according to claim 12, wherein the total thickness of the gate insulating film is 30 nm or greater.

14. The device according to claim 12, wherein the fixed charge is in an energy level of 5.4±1.0 eV.

15. A semiconductor device comprising:
a wide bandgap semiconductor layer:
a gate electrode, and
a gate insulating film provided between the wide bandgap semiconductor layer and the gate electrode, the gate insulating film including: a first insulating film having a thickness of 7 nm or greater: a fixed charge film provided on the first insulating film, the fixed charge film containing fixed charge; and a second insulating film provided on the fixed charge film, the second insulating film having a thickness of 7 or greater, the gate insulating film having a total thickness of 25 nm or greater,
wherein the fixed charge is negative charge, the wide bandgap semiconductor layer is SiC, the fixed charge is in an energy level of 5.4±1.0 eV, and the fixed charge film is a silicon-rich silicon nitride film.

16. The device according to claim 15, herein the total thickness of the gate insulating film is 30 nm or greater.

17. The device according to claim 15, wherein the fixed charge is in an energy level of 5.4±1.0 eV.

* * * * *